United States Patent [19]
Gabara

[11] Patent Number: 5,475,345
[45] Date of Patent: Dec. 12, 1995

[54] ULTRA-FAST MOS DEVICE CIRCUITS

[75] Inventor: Thaddeus J. Gabara, Murray Hill, N.J.

[73] Assignee: AT&T Corp., Murray Hill, N.J.

[21] Appl. No.: 365,857

[22] Filed: Dec. 29, 1994

[51] Int. Cl.[6] .............................. H03B 5/12; H03B 5/18
[52] U.S. Cl. ................ 331/117 FE; 331/96; 331/117 D; 331/173; 331/DIG. 3
[58] Field of Search ................................. 331/45, 57, 60, 331/96, 103, 107 SL, 108 A, 108 C, 117 FE, 117 D, 173, DIG. 3

[56] References Cited

U.S. PATENT DOCUMENTS

| 3,562,558 | 2/1971 | Totten | 331/DIG. 3 X |
| 3,613,029 | 10/1971 | Bartlett | 331/113 R |
| 4,675,617 | 6/1987 | Martin | 331/1 A |
| 5,159,293 | 10/1992 | Pulice | 331/177 X |

FOREIGN PATENT DOCUMENTS

| 2245476 | 3/1974 | Germany | 331/DIG. 3 |
| 2504154 | 5/1976 | Germany | 331/DIG. 3 |

OTHER PUBLICATIONS

Nadler, W.; "DTL Astable Multivibrator Is Fast And Reliable"; *Electronic Design* 13; Jun. 21, 1969. pp. 83–84.

*Primary Examiner*—David Mis

[57] ABSTRACT

A CMOS coupled-tank oscillator for VLSI circuit applications is disclosed. The coupled-tank oscillator has two inverters coupled, input-to-output, by inductances that may be simply wires, and a capacitance acting in parallel with each inverter that may be, simply, the invert's gate capacitance. The invention permits 0.9-micron CMOS oscillators to produce high-frequency signals.

8 Claims, 1 Drawing Sheet

ULTRA-FAST MOS DEVICE CIRCUITS

BACKGROUND OF THE INVENTION

1. Field of the Invention

The present invention pertains to MOS devices suitable for VLSI stuctures. More particularly, the present invention pertains to high-frequency MOS devices.

2. Discussion of Related Art

CMOS is advantageous for VLSI circuits, because of its low power consumption characteristics. However, conventional 0.9-micron CMOS oscillators are limited to frequencies below 800 MHz. Frequencies as high as 1 GHz are difficult to achieve in 0.9 -micron CMOS, so NMOS is often used for frequencies in that range. Conventional NMOS devices can operate at frequencies that are approximately 30% to 50% higher than those achieved by conventional CMOS. However, NMOS lacks the power-efficiency of CMOS, and it is more expensive to fabricate than CMOS.

Bipolar circuits can provide frequencies above 1 GHz, faster than those provided by conventional NMOS, such as the 1.8 GHz achieved by Nguyen & Meyer and reported in "A 1.8 GHz Monolithic LC Voltage-Controlled Oscillator" *IEEE Journal of Solid State Circuits*, March, 1992, pp. 444–450. However, the process used for fabricating bipolar circuits is not compatible with MOS fabrication. Furthermore, these devices require more "real estate" on the chip, generate substantially more heat, and lack the low-power performance capability of either type of MOS devices. Therefore they are less suitable than MOS for VLSI structures, generally, and low power applications, in particular.

These higher frequencies, in the multi-gigahertz range, are highly advantageous for multimedia computer workstations, however. Furthermore, they are required by optical communications links and by personal communications systems (PCS) apparatus such as cellular telephones. However, all MOS circuits operate as resistive-capacitive systems which are response-limited by the resulting RC time constant of the circuit.

SUMMARY OF THE INVENTION

The present invention addresses the practical constraints of VLSI-size oscillator and processor circuits. Device circuits in accordance with the present invention permit extension of the operating frequency of MOS devices by as much as an order of magnitude, 5x to 10x greater than that of conventional MOS devices.

A high-frequency MOS oscillator in accordance with the present invention provides a coupled-tank oscillator, which includes two MOS inverters connected input-to-output by respective inductors. Each inverter has a capacitance acting in parallel across it which cooperates with a respective inductance to form respective tank circuits. Each tank circuit provides positive, regenerative feedback to the respective inverter.

The parallel capacitance may be provided in some part by a particular capacitive element that is added to the circuit.

In a particular embodiment, the capacitances in the circuit are the gate capacitances of the respective inverters.

In a preferred embodiment of the MOS coupled-tank oscillator in accordance with the present invention, the gate capacitance of each inverter substantially provides the capacitance acting in parallel to the respective inverter in accordance with the present invention.

Furthermore, in a preferred embodiment, the frequency of the high-speed CMOS coupled-tank oscillator is selected by selecting the size of the inverters' gates and providing corresponding inductors, rather than using individually-trimmed resistive elements. This reactive, rather than resistive, tuning of the oscillator permits increased power-efficiency to be realized, and simplifies the fabrication of these circuits.

BRIEF DESCRIPTION OF THE DRAWINGS

The features and advantages of the present invention will be better understood when the detailed description of a preferred embodiment given below is considered in conjunction with the drawings provided, wherein.

In these figures, like reference numerals indicate similar structures.

DETAILED DESCRIPTION OF THE PREFERRED EMBODIMENTS

Figure 1:
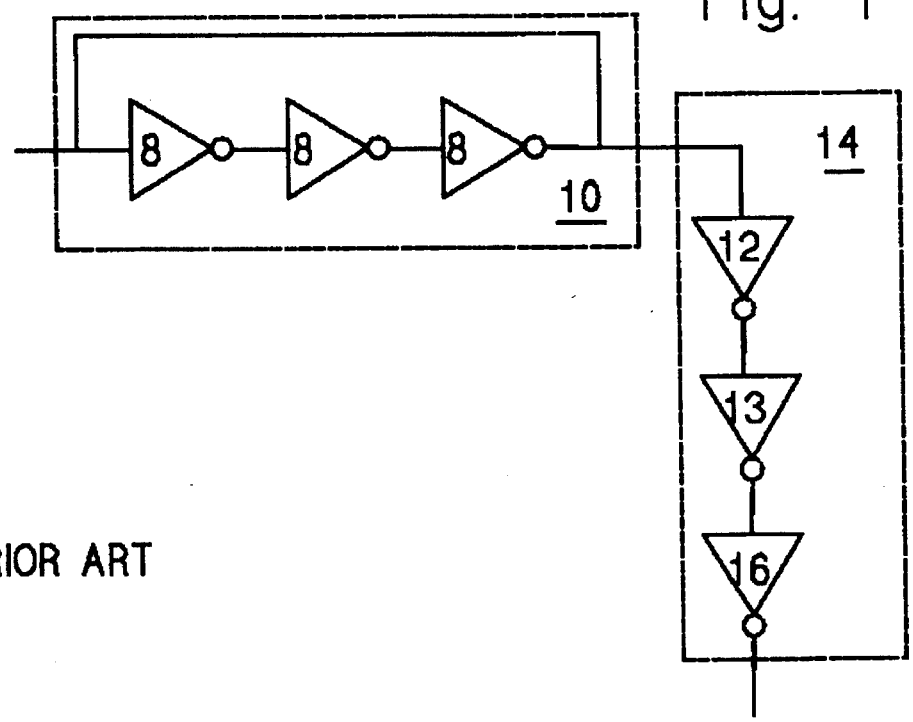
FIG. 1 is a circuit diagram of a conventional CMOS ring oscillator.

FIG. 1 shows the inverters 8 of a conventional prior art MOS ring oscillator 10 and its output-driver string 14 of inverters 12, 14, 16. At 1.2 GHz, which cannot be achieved in conventional 0.9-micron CMOS, this oscillator would dissipate an estimated 270 mW of power, using the $CV^2f$ power formula. However, in accordance with the present invention, the 0.9-micron CMOS coupled-tank inverter oscillator shown in FIG. 2 can oscillate at a frequency of 5 GHz, while dissipating less than 200 mW.

It has been found that CMOS cross-coupled inverter oscillators provide performance beyond the capabilities of the known CMOS oscillator circuits when each of the two inverters 16 is connected as an element in its own LC tank, an oscillator circuit topology here referred to as a "coupled-tank" circuit.

A preferred embodiment of the invention provides a 0.9-micron CMOS oscillator circuit that can produce frequencies as high as 4 GHz when the inductors in the circuit have Q's in the range of 10–25. Also these oscillator circuits have the very low power ratings needed for stable operation in micro-miniaturized computer circuitry and portable, battery-operated communications hardware.

The Q of the inductor is critically important to implementing such high-performance circuits. As Q decreases, the increased losses in the circuit reduce the frequency at which it is capable of operating. However, if the size of the inverters in the circuit is increased to compensate for those losses by increasing their gain, the gate capacitance increase caused by that enlargement reduces the circuit's operating frequency.

The circuit oscillates when the tank circuit has a Q greater than 10, so that these small losses can be replenished by the inverters, sustaining oscillation. The positive, regenerative feedback of the coupled-tank oscillator circuit constructed in accordance with the present invention assures very short rise and fall times at the input to each inverter, on the order of 50 ps, which, in effect, pushes the respective inverter to a higher operating frequency.

The cross-coupled transistors, at rest, resemble a bistable circuit, such as a memory cell, rather than an oscillator. A start-up circuit is needed to set off oscillation. In this circuit, oscillation is initiated by grounding the inverter inputs 36, 38 through the n-channel control transistors 40, until the fields of the respective inductors begin to build. While control transistors 40 are on, current flows from each inverter through the respective inductance, supplied through the inverter's p-channel.

Once current flow is established, the gate signal "S" on the control transistors 40 goes low, turning them off. The resulting collapse of the field across the inductors 20, 22 when S goes low and the control transistors 40 are cutoff causes capacitors 24, 26 to charge. That is, the collapse of the field across the inductors 20, 22 when S subsequently goes low, cutting off the control transistors 40, initiates oscillation in this circuit.

Furthermore, it has been established that, when the tanks in these coupled-tank oscillator circuits have Q's of 10 to 25 and the gate capacitance of the inverters supplies the greater portion of the capacitance acting in parallel with the inverters, the circuits' frequency of oscillation varies with the size of the inverters. Estimated values for circuits having Q's greater than 100, are as follows:

| pCh/nCh | Frequency |
| --- | --- |
| 20/10 | 7.5 GHz |
| 40/20 | 5.5 GHz |
| 60/30 | 4.5 GHz |

The values given here are stated for 0.9-micron CMOS in microns of width relative to frequency at 100 degrees Centigrade.

Because the output frequency varies with the physical size of inverter gates used in these circuits, the operating frequency can be conveniently set by selecting the size of the inverters' gates and providing the corresponding inductor values, rather than using individually-trimmed resistive elements.

Q's of 10 to 25 for inductors are readily obtainable in present day CMOS circuits. For example, the Q's achieved in CMOS multi-chip modules (MCM's) can be as high as 25. In these modules, a chip carrying spiral metalization inductors is mounted above the CMOS logic chip on solder bumps that electrically connect the inductors into the CMOS logic circuits. It should be noted that in these MCM's the precise size of the inverter is less critical to the oscillator's operating frequency:

| pCh/nCh | Frequency |
| --- | --- |
| 500/250 | 3.8 GHz |
| 600/300 | 3.5 GHz |

This is advantageous because it permits the mask design for the chip to provide a more accurate reactive tuning of these oscillators, permitting greater reliance on reactive rather than resistive tuning for the oscillator and, therefore, increased power-efficiency.

Figure 2:
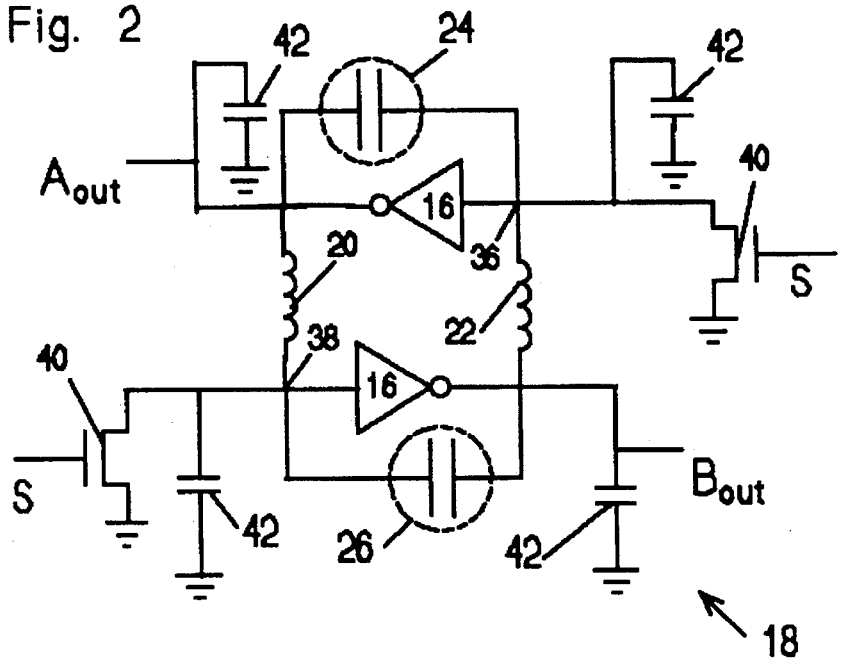
FIG. 2 is a circuit diagram of a CMOS coupled-tank oscillator in accordance with the present invention.

Advantageously, the control transistors 40 shown in FIG. 2 would be 100 microns in width, providing a resistance of about 150 ohms to ground when on. The inverters 16 would be MCM devices having pCh/nCh widths of 500/250 microns, providing about a 1.5 pF capacitive load in the tank circuit and about a 3.8 GHz output. The MCM spiral metalization inductors then should be 2.5 nH with a Q of about 25.

Alternatively, the LC values of this circuit may be approximately 2 nH and the 1 pF gate capacitance acting in parallel with 200/100-micron inverters, producing a 3.5 GHz output. The inductance in this embodiment being formed by the addition of an approximately 1000-micron long 25-micron (1 mil) diameter bonding wire supported by solder pads on the surface of the chip which connect the inductance to the inverters. The bonding-wire inductors in this emodiment provide greater power efficiency than the comparable MCM circuit, but the solder pads used to mount them each have a parasitic capacitance 42 of approximately 0.7 pF, which reduces the operating frequency of these circuits relative to comparable MCM circuits, in which the pads are smaller and, therefore, have a smaller capacitance.

In FIG. 2 the outputs provide periodic signals $A_{out}$ and $B_{out}$ that are synchronous. Equal loads must be applied to these outputs. Since the CMOS gates of inverters 16 used in the coupled-tank oscillator can have a higher capacitance than the gates of the inverters 8 that are usable in conventional ring oscillators 10, the output signals $A_{out}$ and $B_{out}$ the coupled-tank oscillators can be used as a network clock, or delivered directly to an antenna or RF circuit.

In contrast, the CMOS ring requires an output string 14 to scale-up the capacitance of the inverters 8 in the ring oscillator 10, the capacitance increasing approximately three-fold from the ring inverters 8 to each of the scaling inverters 12, 13, and finally to an output inverter 16. The resulting CMOS circuit 10, 14 is unable to achieve the high frequency achieved in accordance with the present invention, and would dissippate ten times more power than a coupled-tank oscillator 18 having a comparable output capacitance. Furthermore, the coupled-tank oscillators in accordance with the invention can accomodate larger capacitive loads without further increasing the size of the output inverter 16, by varying the values of the inductors 20, 22, because the additional load on each of the oscillator's outputs appears to the oscillator circuit as part of the respective tank circuit.

It will be appreciated by one skilled in the art that variations and modifications of the embodiments disclosed herein are possible within the spirit and scope of this invention. For example, these circuits might be implemented in NMOS, to achieve higher operating frequencies, though sacrificing some of the advantages of the CMOS embodiments. The CMOS embodiments described above are provided to illustrate presently preferred ways of making and using this invention. The invention is defined by the claims appended below.

I claim:

1. A coupled-tank oscillator circuit comprising:
   two MOS inverters having respective inputs and outputs;
   an inductor connecting the input of each inverter to the output of the other inverter; and
   a respective capacitance acting in parallel to each of said inverters, whereby higher frequency oscillator operation is obtained.

2. The circuit of claim 1, wherein the operating frequency of said circuit is selected by selecting the size of said inverters.

3. The circuit of claim 1, wherein said capacitances are the gate capacitances of said inverters.

4. The circuit of claim 1, wherein said capacitances include capacitor elements in addition to the gate capacitances of said inverters.

5. A coupled-tank oscillator circuit comprising:
   two MOS inverters having respective inputs and outputs;
   a wire connecting the input of each inverter to the output of the other inverter; and a respective capacitance acting in parallel to each of said inverters, whereby a high-frequency oscillator is provided that is simple to manufacture and provides improved power-efficiency.

6. The circuit of claim 5, wherein the frequency of said circuit is selected by selecting the size of said inverters.

7. A coupled-tank oscillator circuit comprising:

a MCM device including two MOS inverters having respective inputs and outputs and inductors connecting the input of each inverter to the output of the other inverter; and a respective capacitance acting in parallel to each of said inverters, whereby improved high-frequency performance is provided.

8. The circuit of claim 7, wherein the frequency of said circuit is selected by selecting the size of said inverters.

* * * * *